United States Patent
Park et al.

(10) Patent No.: US 11,605,567 B2
(45) Date of Patent: Mar. 14, 2023

(54) METHOD OF MONITORING A SEMICONDUCTOR DEVICE FABRICATION PROCESS AND METHOD OF FABRICATING A SEMICONDUCTOR DEVICE USING THE SAME

(71) Applicant: Samsung Electronics Co., Ltd., Suwon-si (KR)

(72) Inventors: Jitae Park, Suwon-si (KR); Youngjoo Lee, Hwaseong-si (KR); Taekyun Kang, Hwaseong-si (KR); Doo Young Gwak, Suwon-si (KR); Aekyung Kim, Hwaseong-si (KR); Hyowon Bae, Hwaseong-si (KR); Kyunggon You, Seongnam-si (KR); Seongjin In, Suwon-si (KR); Sang Yoon Han, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 136 days.

(21) Appl. No.: 17/212,914

(22) Filed: Mar. 25, 2021

(65) Prior Publication Data
US 2022/0068728 A1 Mar. 3, 2022

(30) Foreign Application Priority Data
Aug. 31, 2020 (KR) .................. 10-2020-0110623

(51) Int. Cl.
*H01L 21/66* (2006.01)
*H01J 37/32* (2006.01)

(52) U.S. Cl.
CPC ........ *H01L 22/24* (2013.01); *H01J 37/32972* (2013.01); *H01J 2237/3341* (2013.01)

(58) Field of Classification Search
CPC .................. H01L 22/24; H01L 21/67253
See application file for complete search history.

(56) References Cited

U.S. PATENT DOCUMENTS 6,358,359 B1   3/2002   Peinador et al.
6,492,186 B1   12/2002  Han et al.
(Continued)

FOREIGN PATENT DOCUMENTS

KR   1020030006812 A   1/2003
KR   1020120126418 A   11/2012
(Continued)

*Primary Examiner* — Binh X Tran
(74) *Attorney, Agent, or Firm* — Muir Patent Law, PLLC

(57) ABSTRACT

Disclosed are a method of monitoring a semiconductor device fabrication process and a method of fabricating a semiconductor device using the same. The monitoring method may include determining a normalization range of a target byproduct, which is a measurement target of byproducts produced in a chamber by an etching process, the byproducts including the target byproduct and a non-target byproduct, the target byproduct including first and second target byproducts, which are respectively produced by and before the etching process on a to-be-processed layer, obtaining a first index from a ratio of the target byproduct to the non-target byproduct, obtaining a second index by subtracting an emission intensity of the second target byproduct from the first index, obtaining a third index by integrating the second index on a time interval, and estimating a result of the etching process and presence or absence of a failure, based on the third index.

20 Claims, 9 Drawing Sheets

(56) References Cited

U.S. PATENT DOCUMENTS

| | | | |
|---|---|---|---|
| 8,747,686 B2 | 6/2014 | Zheng et al. | |
| 9,200,950 B2 * | 12/2015 | Lian | G01J 1/0488 |
| 9,299,542 B2 | 3/2016 | Jung | |
| 9,930,766 B2 | 3/2018 | Chan et al. | |
| 2006/0196846 A1 | 9/2006 | Honda | |
| 2017/0140905 A1 * | 5/2017 | Mihaylov | H01J 37/32972 |
| 2017/0154780 A1 | 6/2017 | Yang et al. | |
| 2018/0068831 A1 * | 3/2018 | Chen | H01L 21/30655 |
| 2018/0143141 A1 * | 5/2018 | Omstead | G01N 21/73 |
| 2018/0269119 A1 * | 9/2018 | Coppa | H01L 21/31116 |
| 2020/0319025 A1 | 10/2020 | Kim et al. | |

FOREIGN PATENT DOCUMENTS

| | | |
|---|---|---|
| KR | 1020150015600 A | 2/2015 |
| KR | 1020200118349 A | 10/2020 |

* cited by examiner

METHOD OF MONITORING A SEMICONDUCTOR DEVICE FABRICATION PROCESS AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2020-0110623, filed on Aug. 31, 2020, in the Korean Intellectual Property Office, the entire contents of which are hereby incorporated by reference.

BACKGROUND OF THE INVENTION

The present disclosure relates to a method of monitoring a semiconductor device fabrication process and a method of fabricating a semiconductor device using the same, and in particular, to a monitoring method capable of estimating a result of an etching process on a semiconductor device and the presence or absence of a failure and a method of fabricating a semiconductor device using the same.

In general, a semiconductor device is fabricated by forming a to-be-processed layer on a semiconductor substrate and performing an etching process several times. Here, the etching process is performed to form patterns, which constitute the semiconductor device, from the to-be-processed layer. The etching process may be a wet etching process and/or a dry etching process, and in order to form a fine pattern satisfying a recent design rule of 0.15 µm or smaller, the dry etching process is generally used.

The dry etching process includes applying a radio frequency (RF) power to a chamber and controlling an etching gas, a chamber pressure, and so forth. The RF power may be used to produce plasma from the etching gas, and in this case, a specific region of the to-be-processed layer may be etched by a chemical reaction between the to-be-processed layer and the plasma of the etching gas.

An optical emission spectroscope (OES) is widely used to monitor the etching process. By using the optical emission spectroscope, it is possible to obtain useful information on byproducts, which are produced in the reaction with the to-be-processed layer. Discontinuous electron energy levels of an atom and an ion are used in the optical emission spectroscope. For example, transition of an electron from a high energy state to a low energy state leads to emission of light, and this emission of light occurs in the plasma for the dry etching process. Especially, in the case of the plasma for the dry etching process, a wavelength of the emission light is changed depending on the to-be-etched layer and the supplied etching gas.

SUMMARY

An embodiment of the inventive concept provides a monitoring method, which can obtain precise information on an etching amount of a target byproduct in a semiconductor device fabrication process, and a method of fabricating a semiconductor device using the same.

According to an embodiment of the inventive concept, a method of monitoring a semiconductor device fabrication process may include determining a normalization range of a target byproduct, which is a measurement target of byproducts produced in a chamber by an etching process, the byproducts including the target byproduct and a non-target byproduct, the target byproduct including a first target byproduct, which is produced by the etching process on a to-be-processed layer, and a second target byproduct, which is produced before the etching process on the to-be-processed layer, obtaining a first index from a ratio of the target byproduct to the non-target byproduct, obtaining a second index by subtracting an emission intensity of the second target byproduct from the first index, obtaining a third index by integrating the second index on a time interval, and estimating a result of the etching process and presence or absence of a failure, based on the third index.

According to an embodiment of the inventive concept, a method of fabricating a semiconductor device may include fabricating a semiconductor device through a deposition process of forming a plurality of layers on a substrate and an etching process of etching at least a portion of the plurality of layers and monitoring the fabricating of the semiconductor device. The monitoring the fabricating of the semiconductor device may include determining a normalization range of a target byproduct, which is a measurement target of byproducts produced in a chamber by the etching process, the byproducts including the target byproduct and a non-target byproduct, the target byproduct including a first target byproduct, which is produced by the etching process on a to-be-processed layer, and a second target byproduct, which is produced before the etching process on the to-be-processed layer, obtaining a first index from a ratio of the target byproduct to the non-target byproduct, obtaining a second index by subtracting an emission intensity of the second target byproduct from the first index, obtaining a third index by integrating the second index on a time interval, and estimating a result of the etching process and presence or absence of a failure, based on the third index.

According to an embodiment of the inventive concept, a method of fabricating a semiconductor device may include alternately stacking insulating layers and sacrificial layers on a substrate to form a stack, performing a plasma etching process to form a plurality of channel holes penetrating the stack, and monitoring the plasma etching process on the channel holes. The monitoring of the plasma etching process may include determining a normalization range of a target byproduct, which is a measurement target of byproducts produced in a chamber by the plasma etching process, the byproducts including the target byproduct and a non-target byproduct, the target byproduct including a first target byproduct, which is produced by the plasma etching process on a to-be-processed layer, and a second target byproduct, which is produced before the plasma etching process on the to-be-processed layer, obtaining a first index from a ratio of the target byproduct to the non-target byproduct, obtaining a second index by subtracting an emission intensity of the second target byproduct from the first index, obtaining a third index by integrating the second index on a time interval, and estimating a result of the plasma etching process and presence or absence of a failure, based on the third index.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

A method of monitoring a semiconductor device fabrication process according to an embodiment of the inventive concept and a method of fabricating a semiconductor device using the same will now be described more fully with reference to the accompanying drawings, in which example embodiments are shown.

Figure 1:
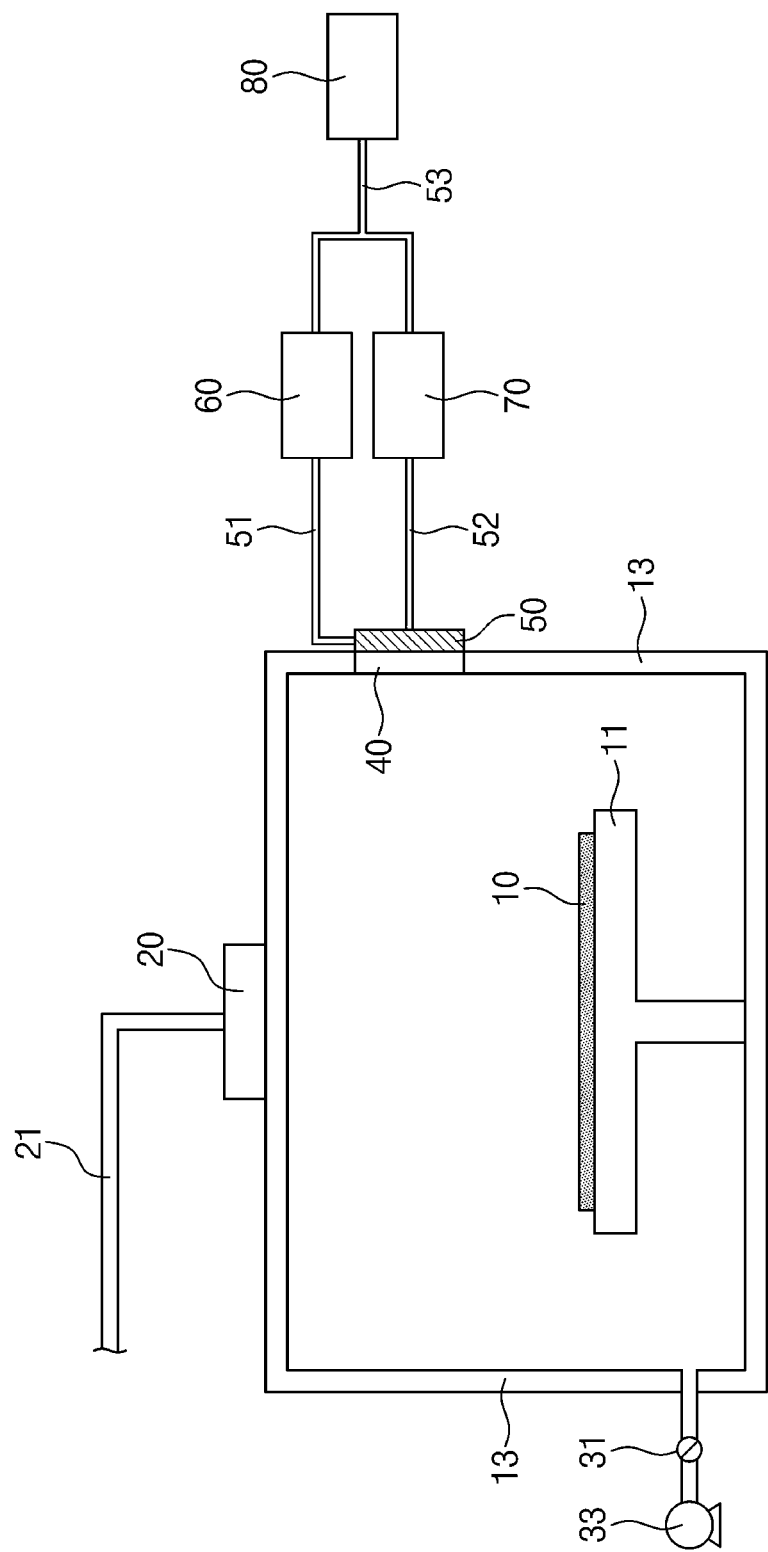
FIG. 1 is a conceptual diagram illustrating an etching device, which is used to perform some steps of a semiconductor device fabrication process, according to an example embodiment of the inventive concept.

FIG. 1 is a conceptual diagram illustrating an etching device, which is used to perform some steps of a semiconductor device fabrication process, according to an example embodiment of the inventive concept.

Referring to FIG. 1, a chamber 13 may be provided and may be used to perform an etching process on a layer formed on a semiconductor substrate 10. A plurality of layers may be stacked on the semiconductor substrate 10, and the etching process may be performed to etch at least some of the plurality of layers. For example, the etching process may be a dry etching process performed using plasma.

A chuck 11, on which the semiconductor substrate 10 is loaded, may be provided in an inner space of the chamber 13. Although not shown, a lower electrode, to which a radio frequency (RF) power to produce plasma from an etching gas is applied, may be provided in the chuck 11 or a lower portion of the chamber 13, and an upper electrode may be provided in an upper portion of the chamber 13. In the case where the power is applied to the lower electrode, the upper electrode may be used as a ground electrode.

A gas supplying part 20 may be provided on the upper portion of the chamber 13. An etching gas, which will be used to produce plasma, may be supplied to the chamber 13 by a gas supplying line 21 connected to the gas supplying part 20. The etching gas may include at least one of inert or inactivate gases (e.g., argon (Ar) and nitrogen ($N_2$)) and/or halogen-based gases (e.g., $Cl_2$, $CCl_4$, $CF_2Cl_2$, $CF_3Cl$, $CF_4$, $C_2F_6$, $SF_6$, $CHF_3$, $CBrF_3$, and $CH_2F_2$).

A valve 31 and a pump 33 may be connected to a sidewall of the chamber 13. The pump 33 may be used to vacuumize the inner space of the chamber 13. An unreacted gas and a reaction byproduct, which is produced during the etching process, may be exhausted to the outside of the chamber 13 through the pump 33. The valve 31 may be opened or closed, depending on an operation state of the pump 33, and may be used to control a vacuum level of the inner space of the chamber 13.

A view port 40 may be provided in the sidewall of the chamber 13. In detail, the view port 40 may be provided in a window structure surrounded by the sidewall of the chamber 13. The view port 40 may be formed of or include, for example, quartz or sapphire. The view port 40 may include an optical filter allowing only light of specific wavelength to pass therethrough. A calibration adapter 50 may be provided on the view port 40. The calibration adapter 50 may be connected to a calibration device 60 through a first optical fiber 51.

The calibration device 60 may include a light source and an optical system, which is configured to obtain a reference spectrum of the light source. For example, the calibration device 60 may include a Hg—Ar light source. In the case where the etching process is performed in a plurality of chambers 13, a wavelength spectrum measured from the same material may vary from chamber to chamber. For example, a wavelength spectrum, which is measured from one of the chambers 13, may be shifted from a wavelength spectrum, which is measured from another of the chambers 13, by a specific amount. The calibration device 60 may be configured to compensate, such as wavelength shift, and thereby to precisely obtain the wavelength spectrum. For example, the calibration device 60 may be configured to achieve a matching between wavelength spectra, which are obtained from different chambers 13. In an embodiment, the compensation of the wavelength shift by the calibration device 60 may be performed before a step of obtaining a first index to be described below.

The view port 40 may be connected to a sensor 70 through the calibration adapter 50 and a second optical fiber 52. For example, the sensor 70 may include an optical emission spectroscope (OES). The sensor 70 may convert at least a portion of an optical signal, which is transmitted through the view port 40, to an electrical signal. Unlike that illustrated in the drawings, the view port 40 and the sensor 70, which is configured to detect an optical signal emitted through the view port 40, may be provided in plural.

The calibration device 60 and the sensor 70 may be connected to a control unit 80 through a third optical fiber 53. The control unit 80 may be configured to analyze the electrical signal, which is provided to the control unit 80 from the sensor 70, and to generate a control signal based on the result of the analysis. For example, the control signal generated by the control unit 80 may be used for an end-point detection (EPD) device for determining an etch end-point based on a change of an electrical signal.

Although not illustrated, the control unit 80 can include one or more of the following components: at least one processor configured to execute computer program instructions to perform various processes and methods of the method of monitoring a semiconductor device fabrication process (e.g., central processing unit (CPU), graphics processing unit (GPU), etc.), random access memory (RAM) and read only memory (ROM) configured to access and store data and information and computer program instructions, input/output (I/O) devices configured to provide input and/or output to a processing controller (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the control unit 80 can include antennas, network interfaces that provide wireless and/or wire line digital and/or analog interface to one or more networks over one or more network connections (not shown), a power source that provides an appropriate alternating current (AC) or direct current (DC) to power one or more components of the control unit 80, and a bus that allows communication among the various components of the control unit 80. The control unit 80 may be configured to perform the method of monitoring a semiconductor device fabrication process, as disclose herein.

Figure 2:
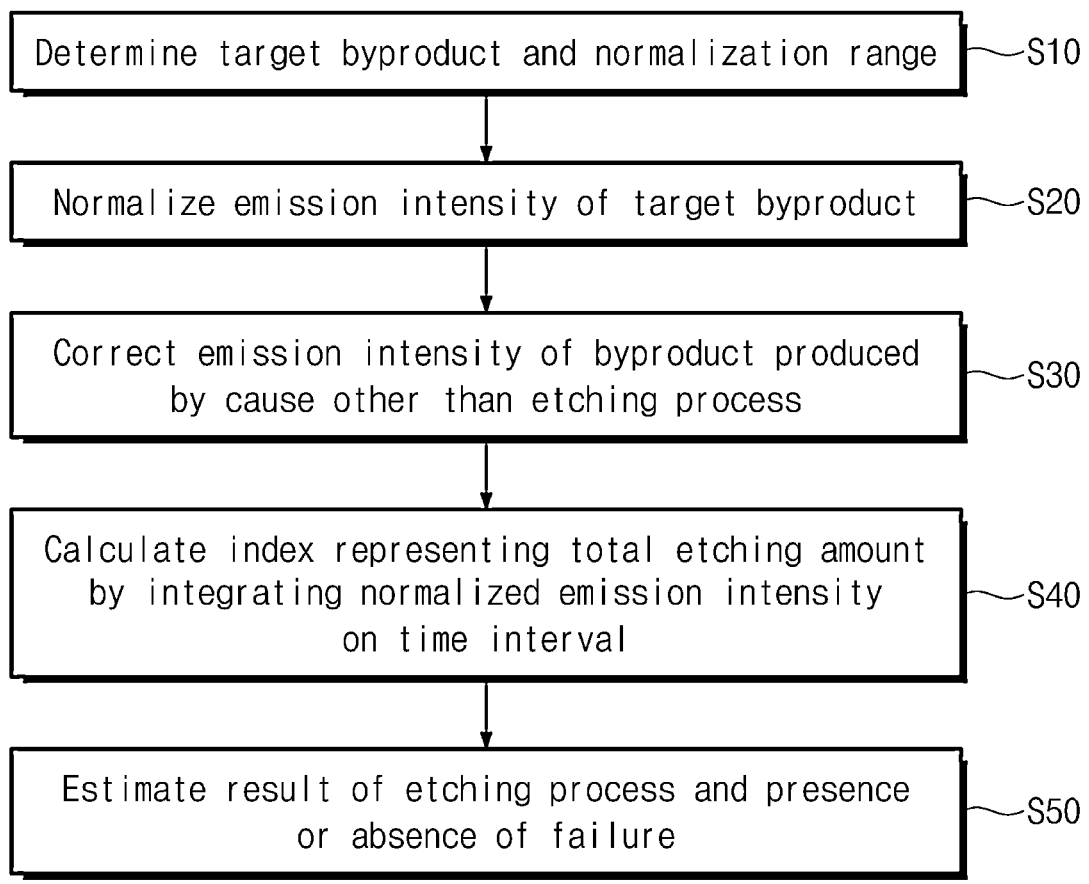
FIG. 2 is a flow chart illustrating a method of monitoring a semiconductor device fabrication process, according to an example embodiment of the inventive concept.

FIG. 2 is a flow chart illustrating a method of monitoring a semiconductor device fabrication process, according to an example embodiment of the inventive concept. The method illustrated in FIG. 2 may be performed by the control unit 80 executing computer program instructions to monitor a semiconductor device fabrication process.

Referring to FIG. 2, the method of monitoring a semiconductor device fabrication process may include determining a target byproduct, which is chosen as a measurement target among byproducts produced in a chamber by an etching process, and a normalization range for the target byproduct (S10), normalizing an emission intensity of the target byproduct (S20), correcting an emission intensity of the byproduct, which is produced by a cause other than the etching process (S30), calculating an index representing a total etching amount by integrating the normalized emission intensity on a time interval (S40), and estimating the result of the etching process and the presence or absence of a failure, based on the index representing the total etching amount (S50).

Various byproducts may be produced in a chamber, in which an etching process on a to-be-processed layer is performed. The byproducts may include a target byproduct, which is a measurement target, and a non-target byproduct. The target byproduct may be a material, which is produced by a reaction between plasma and the to-be-processed layer. The target byproduct may vary depending on the kind of the to-be-processed layer. For example, the target byproduct may be CN, SiF, or CO.

If the target byproduct as the measurement target is determined based on the kind of the to-be-processed layer, byproducts, other than the target byproduct, may be defined as a non-target byproduct. In the case where the target byproduct is a polyatomic molecule, in which two or more atoms are bonded, an emission intensity of the target byproduct may include a plurality of peaks. For example, when the target byproduct is a diatomic molecule, an emission intensity of the target byproduct may include five peaks according to its vibration and rotation state. If the target byproduct is determined, a normalization range including a plurality of peaks in the emission intensity of the target byproduct may be determined. According to an embodiment of the inventive concept, the normalization may be performed on not only a monatomic radical but also a polyatomic ion.

If the normalization range is determined, the emission intensity of the target byproduct may be normalized within the normalization range. The normalization may be performed to eliminate a deviation in emission intensity between several chambers, which are used to perform the etching process, and thereby to obtain a first index representing the emission intensity of the target byproduct. The obtaining the first index by normalizing the emission intensity of the target byproduct will be described in more detail with reference to FIG. 3.

The target byproduct may include a first target byproduct, which is produced by the etching process on the to-be-processed layer, and a second target byproduct, which is produced before performing the etching process on the to-be-processed layer. The first target byproduct and the second target byproduct may be the same material but may be produced by different causes or processes. The second target byproduct may be a byproduct, which is produced by a non-etching cause (e.g., an unintended reaction of an etching gas and the to-be-processed layer). For example, in the case where the target byproduct is CN, the first target byproduct may be formed by a plasma etching of a nitride layer, and the second target byproduct may be formed by a reaction between an $NF_3$ gas in the chamber and plasma.

A second index may be obtained by subtracting an emission intensity of the second target byproduct from the first index, which is obtained by the normalization. The second index may represent only an emission intensity of the first target byproduct, which is produced by the etching process. The obtaining of the second index will be described in more detail with reference to FIGS. 4 and 5.

Since the second index is a function of time, a third index representing a total etching amount of the to-be-processed layer may be obtained by integrating the second index on a time interval.

Based on the third index, it may be possible to precisely estimate the result of the etching process and the presence or absence of a failure. In detail, the estimating of the result of the etching process and the presence or absence of a failure may be performed by comparing the third index, which is obtained from each of each of the chambers. The third index may represent the total etching amount of the to-be-processed layer and may be used as a reference for comparing and/or estimating etching amounts in different chambers. The estimating of the result of the etching process and the presence or absence of a failure based on the third index will be described in more detail with reference to FIGS. 6A and 6B.

In the method of monitoring a semiconductor device fabrication process, according to an example embodiment of the inventive concept, the calibration device described with reference to FIG. 1 may be used to compensate a wavelength shift between different chambers and thereby to precisely measure the wavelength, and by eliminating a deviation in emission intensity between different chambers and an emission intensity of a byproduct caused by a non-etching cause, it may be possible to precisely compare and/or estimate the total etching amounts in different chambers. According to an embodiment of the inventive concept, it may be possible to monitor a process result and the presence or absence of a failure on a wafer, on which the etching process has been performed, without an additional measurement using a measurement device.

Figure 3:
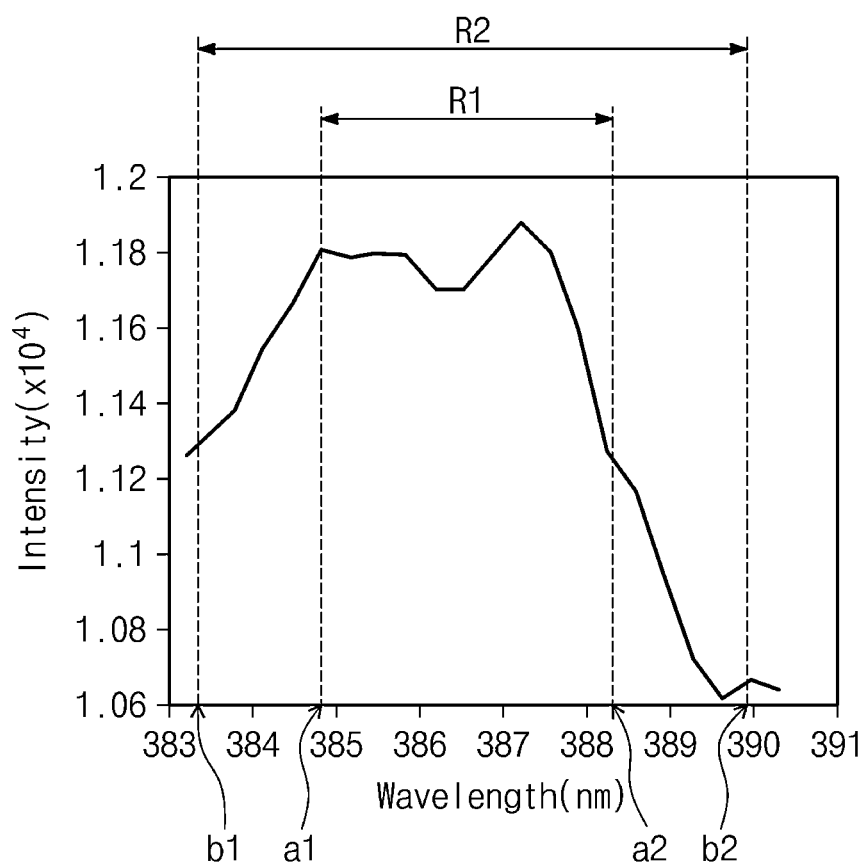
FIG. 3 is a graph illustrating normalization of an emission intensity of a target byproduct, in a method of monitoring a semiconductor device fabrication process, according to an example embodiment of the inventive concept.

FIG. 3 is a graph illustrating normalization of an emission intensity of a target byproduct, in a method of monitoring a semiconductor device fabrication process, according to an example embodiment of the inventive concept. FIG. 3 illustrates an emission intensity versus a wavelength of a light emitted from a chamber in which the etching process is performed.

Referring to FIG. 3, a first wavelength range R1 may be defined as a wavelength range including a plurality of peaks exhibited by the emission intensity of the target byproduct. A second wavelength range R2 may be a wavelength range, which is two times wider than the first wavelength range R1 and is defined to have the same center as that of the first wavelength range R1. FIG. 3 illustrates an example in which the first wavelength range R1 and the second wavelength range R2 are defined for the case where the target byproduct is CN. As an example, the first wavelength range R1 may range from about 384.5 nm to 388.5 nm, and the second wavelength range R2 may range from about 382.5 nm to 390.5 nm.

However, the inventive concept is not limited to this example, and in the case where other material is selected as the target byproduct, the first wavelength range R1 and the second wavelength range R2 may be changed. As an example, in the case where the target byproduct is SiF, the first wavelength range R1 may range from about 434 nm to 450 nm, and in the case where the target byproduct is CO, the first wavelength range R1 may range from about 280 nm to 320 nm.

In detail, normalizing the emission intensity of the target byproduct and obtaining the first index representing the emission intensity of the target byproduct through the normalization may be explained by the following equation 1.

[Equation 1]
$$N_1(t) = \frac{\int_{a_1}^{a_2} I(\lambda, t)d\lambda}{\int_{b_1}^{b_2} I(\lambda, t)d\lambda - \int_{a_1}^{a_2} I(\lambda, t)d\lambda} = \frac{s+n_2}{(s+n_1+n_2+n_3)-(s+n_2)} =$$
$$\frac{s+n_2}{n_1+n_3} \simeq 1 + \frac{s}{2n} = 1 + \frac{1}{2n} \times (s_{mold} + s_{BG}) = 1 + \frac{s_{BG}}{2n} + \frac{s_{mold}}{2n},$$

where $N_1(t)$ is a first index given as a function of time, I is a light emission intensity given as a function of wavelength $\lambda$ and time t, $a_1$ and $a_2$ are lower and upper limits, respectively, of the first wavelength range R1, and $b_1$ and $b_2$ are lower and upper limits, respectively, of the second wavelength range R2.

In addition, s is an emission intensity of the target byproduct within the first wavelength range R1, $n_1$ is an emission intensity of the non-target byproduct within a wavelength range from $b_1$ to $a_1$, $n_2$ is an emission intensity of the non-target byproduct within the first wavelength range R1, $n_3$ is an emission intensity of the non-target byproduct within a wavelength range from $a_2$ to $b_2$.

Furthermore, $s_{mold}$ is an emission intensity of the first target byproduct, which is produced by the etching process on the to-be-processed layer, and $s_{BG}$ is an emission intensity of the second target byproduct, which is produced before performing the etching process on the to-be-processed layer.

The first index $N_1(t)$ may be defined as a ratio of the target byproduct to the non-target byproduct. When an integral with respect to a wavelength of an emission intensity on the first wavelength range R1 is defined as a first intensity and an integral with respect to a wavelength of an emission intensity on the second wavelength range R2 is defined as a second intensity, the first index $N_1(t)$ may be calculated as a ratio of the first intensity to a difference between the first intensity and the second intensity.

If the non-target byproduct is assumed to have a uniform distribution or to have an emission intensity proportional to a length of the wavelength range regardless of the wavelength (i.e., $n_2=2n$, $n_1=n_3=n$), the first index $N_1(t)$ may represent a signal-to-noise ratio (SNR) of the target byproduct at the first wavelength range R1. Since the first index $N_1(t)$ is obtained by the normalization, it may be possible to reduce deviation in emission intensity between several chambers, which may be caused by a difference in internal pressure, a difference in magnitude of the RF power, a difference in transmittance caused by clogging of the view port, and/or a difference in sensitivity between sensors.

Figure 4:
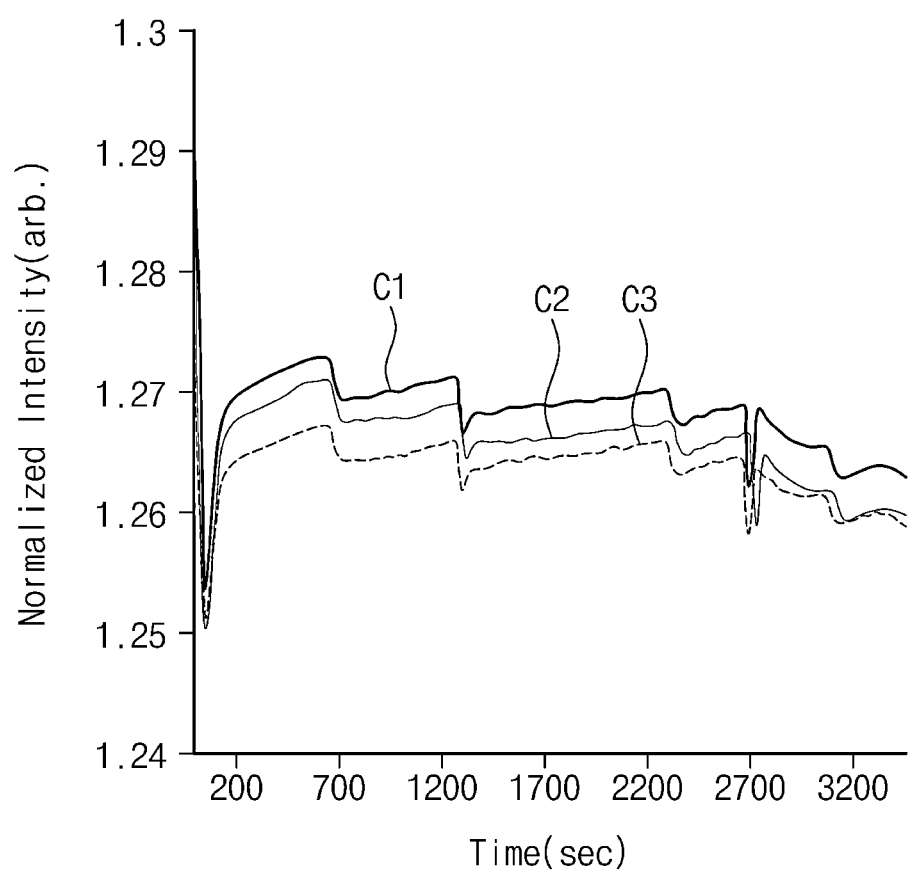
FIGS. 4 and 5 are graphs illustrating a step of correcting an emission intensity, which is caused by a cause other than an etching process, in a method of monitoring a semiconductor device fabrication process, according to an example embodiment of the inventive concept.
Figure 5:
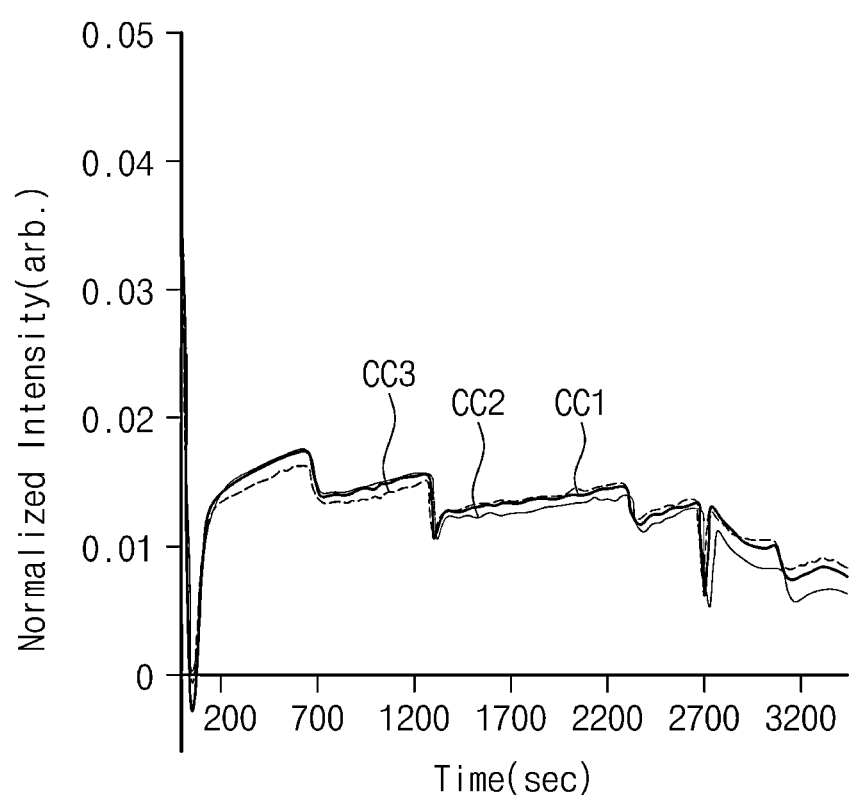

FIGS. 4 and 5 are graphs illustrating a step of correcting an emission intensity, which is caused by a cause other than an etching process, in a method of monitoring a semiconductor device fabrication process, according to an example embodiment of the inventive concept, and each of FIGS. 4 and 5 illustrates a normalized intensity over time. The normalized intensity may mean the first index $N_1(t)$ described with reference to FIG. 3 and Equation 1.

Referring to FIG. 4, first to third curves C1, C2, and C3 show normalized intensities (i.e., first indices) obtained from chambers different from each other. The first to third curves C1, C2, and C3 had substantially the same shape and were shifted from each other by specific magnitudes.

Referring to FIG. 5, first to third corrected curves CC1, CC2, and CC3 show results obtained by correcting the first to third curves C1, C2, and C3 of FIG. 4. The first to third corrected curves CC1, CC2, and CC3 had substantially the same shape and were shifted from each other by specific magnitudes, but the magnitudes of the shifts was smaller than those of the first to third curves C1, C2, and C3.

The correcting of the first to third curves C1, C2, and C3 of FIG. 4 or the obtaining of the first to third corrected curves CC1, CC2, and CC3 of FIG. 5 may include subtracting an emission intensity of the second target byproduct, which was produced before an etching process on a to-be-processed layer, from the first index to obtain a second index. In detail, obtaining the second index may be explained by the following equation 2.

[Equation 2]
$$N_2(t) = N_1(t) - N_1(t_0) = \frac{s_{mold}}{2n}(t), N_1(t_0) = 1 + \frac{s_{BG}}{2n},$$

where $N_2(t)$ is a second index given as a function of time, and $N_1(t_0)$ is an emission intensity of the second target byproduct, which is produced before performing the etching process on the to-be-processed layer. Here, to is a start time of the etching process. For example, $N_1(t_0)$ is a value of the first index $N_1(t)$ corresponding to the start time of the etching process.

Since the second index $N_2(t)$ is obtained by subtracting the emission intensity of the second target byproduct from the first index $N_1(t)$, the second index $N_2(t)$ may represent a signal-to-noise ratio $$\frac{S_{mold}}{2n}(t),$$

of the first target byproduct. In each chamber, the shifted magnitude of the second index $N_2(t)$ may be smaller than that of the first index $N_1(t)$.

Figure 6A:
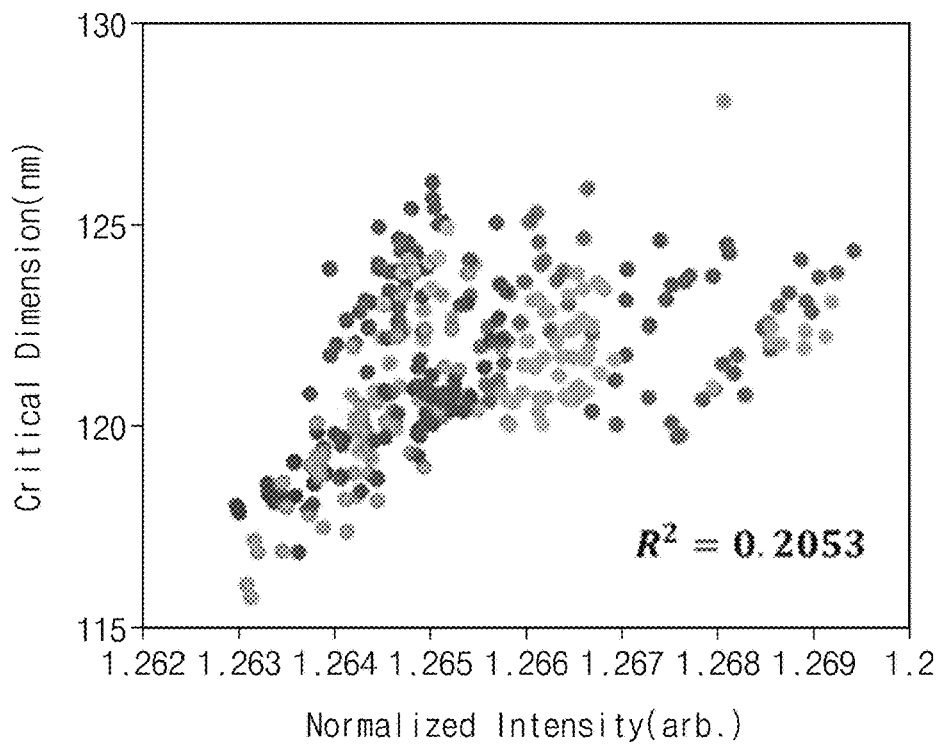
FIGS. 6A and 6B are graphs illustrating a step of estimating a critical dimension (CD) using an index, which is calculated by a method of monitoring a semiconductor device fabrication process, according to an example embodiment of the inventive concept.
Figure 6B:
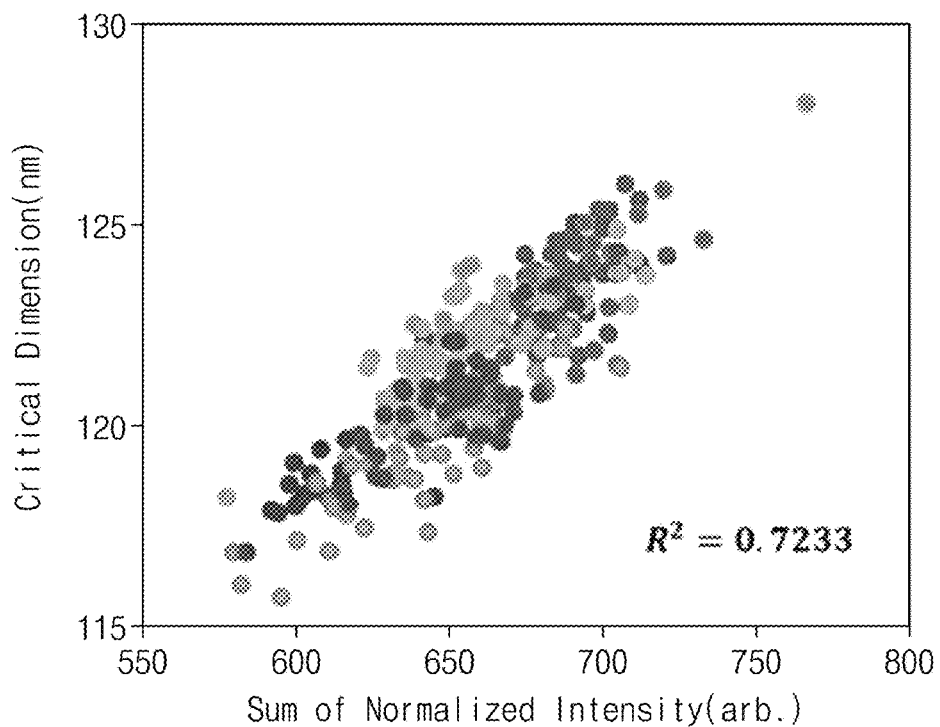

FIGS. 6A and 6B are graphs illustrating a step of estimating a critical dimension (CD) using an index, which is calculated by a method of monitoring a semiconductor device fabrication process according to an embodiment of the inventive concept. FIG. 6A shows a distribution of CD with respect to the first index, and FIG. 6B shows a distribution of CD with respect to a third index. The CD may be defined as a line width of a pattern or hole formed by the etching process on the to-be-processed layer.

Referring to FIG. 6A, a determination coefficient $R^2$ of the distribution of CD with respect to the first index was about 0.2053. By contrast, referring to FIG. 6B, a determination coefficient $R^2$ of the distribution of CD with respect to the third index was about 0.7233. For example, the determination coefficient $R^2$ of the distribution of CD with respect to the third index was greater than the determination coefficient $R^2$ of the distribution of CD with respect to the first index.

FIGS. 6A and 6B mean that the deviation of the third index in different chambers is smaller than the deviation of the first index, and this is because the third index represents just a total etching amount in each chamber, not a condition of each chamber. Thus, the distribution of CD with respect to the third index shown in FIG. 6B may be used to more precisely estimate or predict the result of the etching process and the presence or absence of a failure.

In detail, obtaining the third index may be explained by the following equation 3.

$$N_3 = \int_{t_0}^{t_e} \frac{S_{mold}}{2n}(t)dt, \quad \text{[Equation 3]}$$

where $N_3$ is the third index that is scalar. Here, to is a start time of the etching process, $t_e$ is an end time of the etching process, and $$\frac{S_{mold}}{2n}(t)$$

is a signal-to-noise ratio of the first target byproduct.

The third index $N_3$ is a value that is obtained by integrating the signal-to-noise ratio of the first target byproduct on a time interval of the etching process. The third index $N_3$ may represent information on a total etching amount and may be used to precisely estimate or predict the result of the etching process and the presence or absence of a failure. For example, since, in general, the third index $N_3$ is proportional to CD, the third index $N_3$ may be used to determine whether the etching process is performed at a desired extent and to easily find a position of a failure.

According to an example embodiment of the inventive concept, a method of fabricating a semiconductor device may include stacking a plurality of layers on a substrate, etching at least a portion of the layers to form a semiconductor device, and monitoring the fabrication process of the semiconductor device using the afore-described monitoring method.

Figure 7:
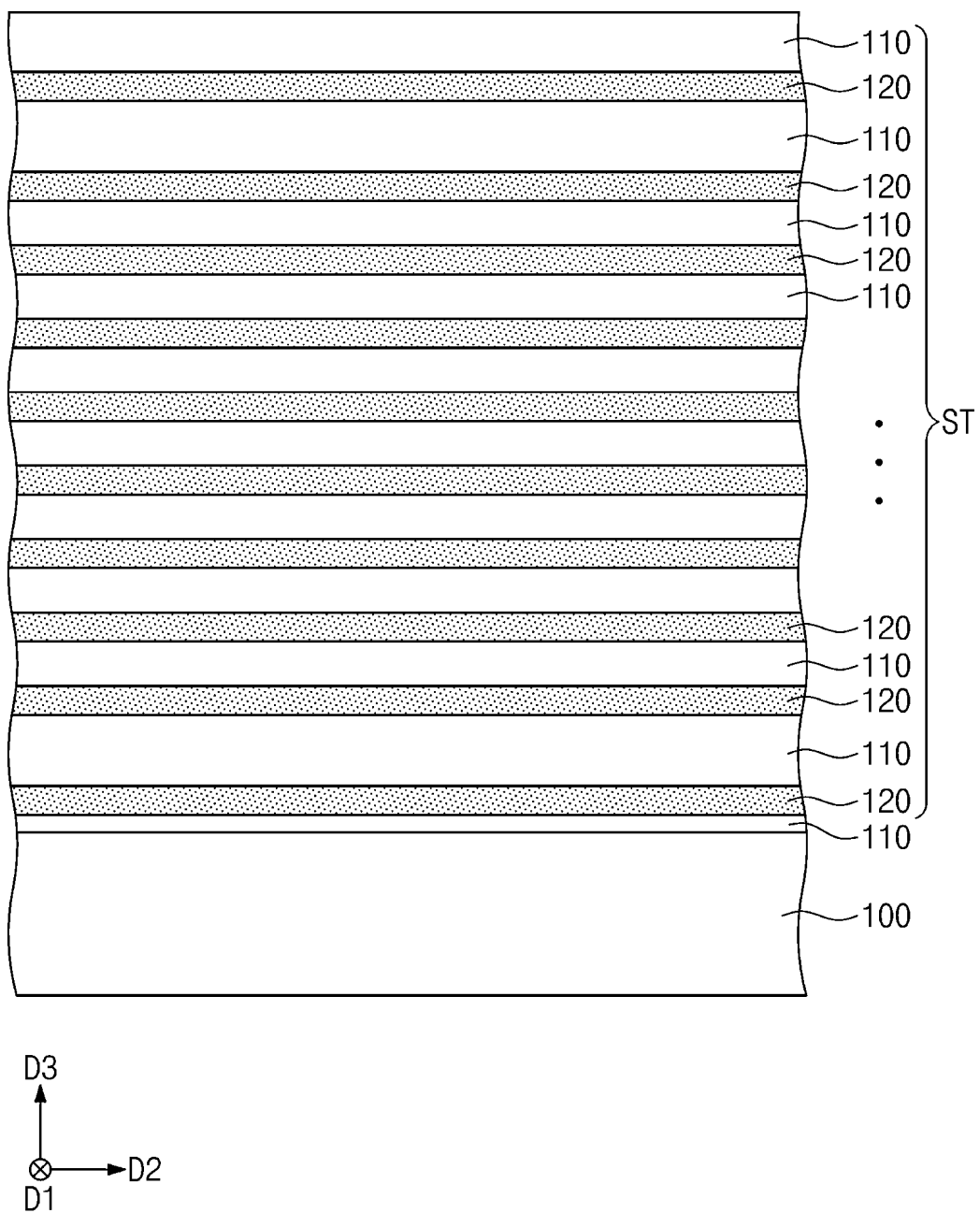
FIGS. 7 to 9 are sectional views illustrating a method of fabricating a semiconductor device using a method of monitoring a semiconductor device fabrication process, according to an example embodiment of the inventive concept.
Figure 8:
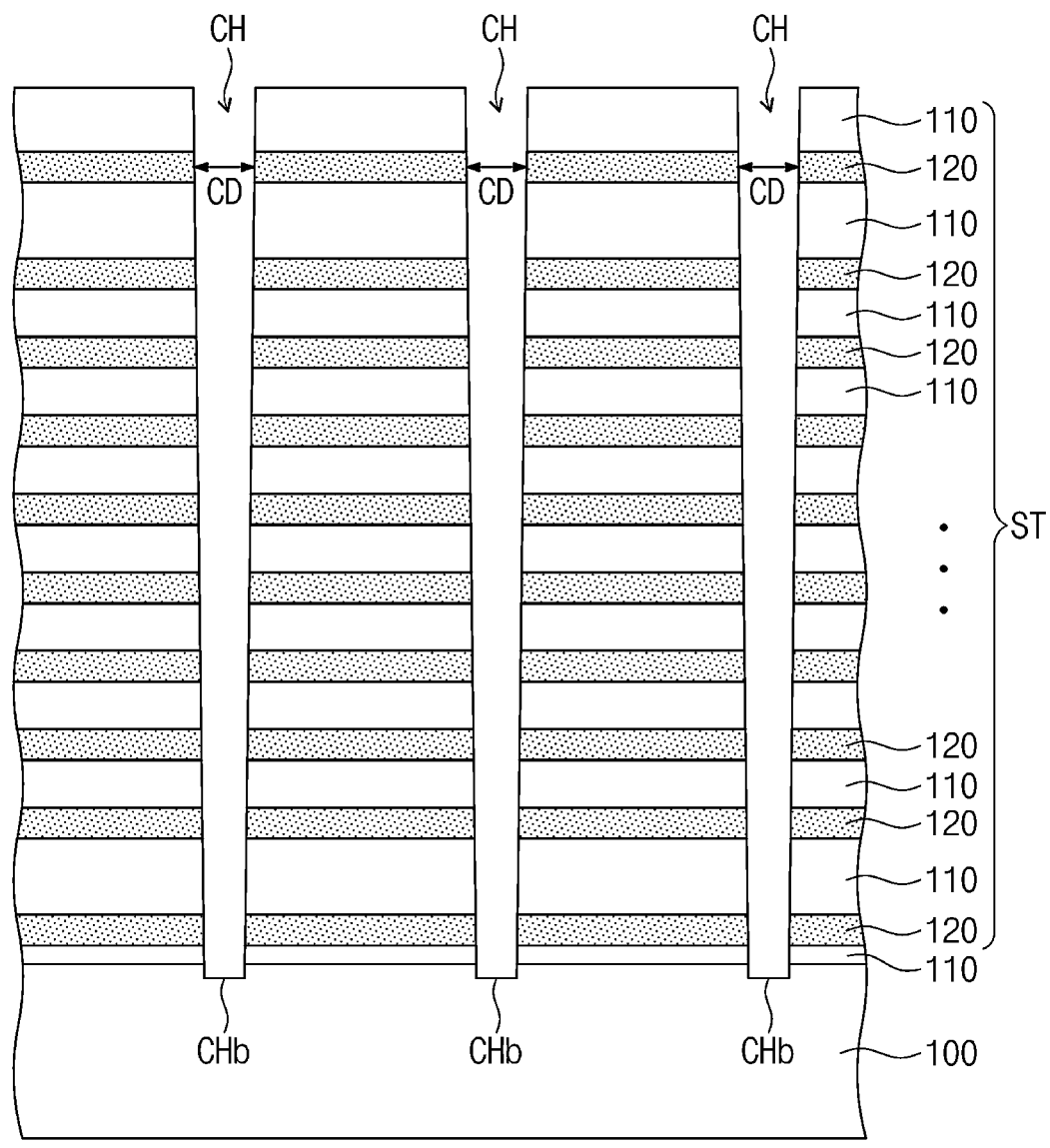
Figure 9:
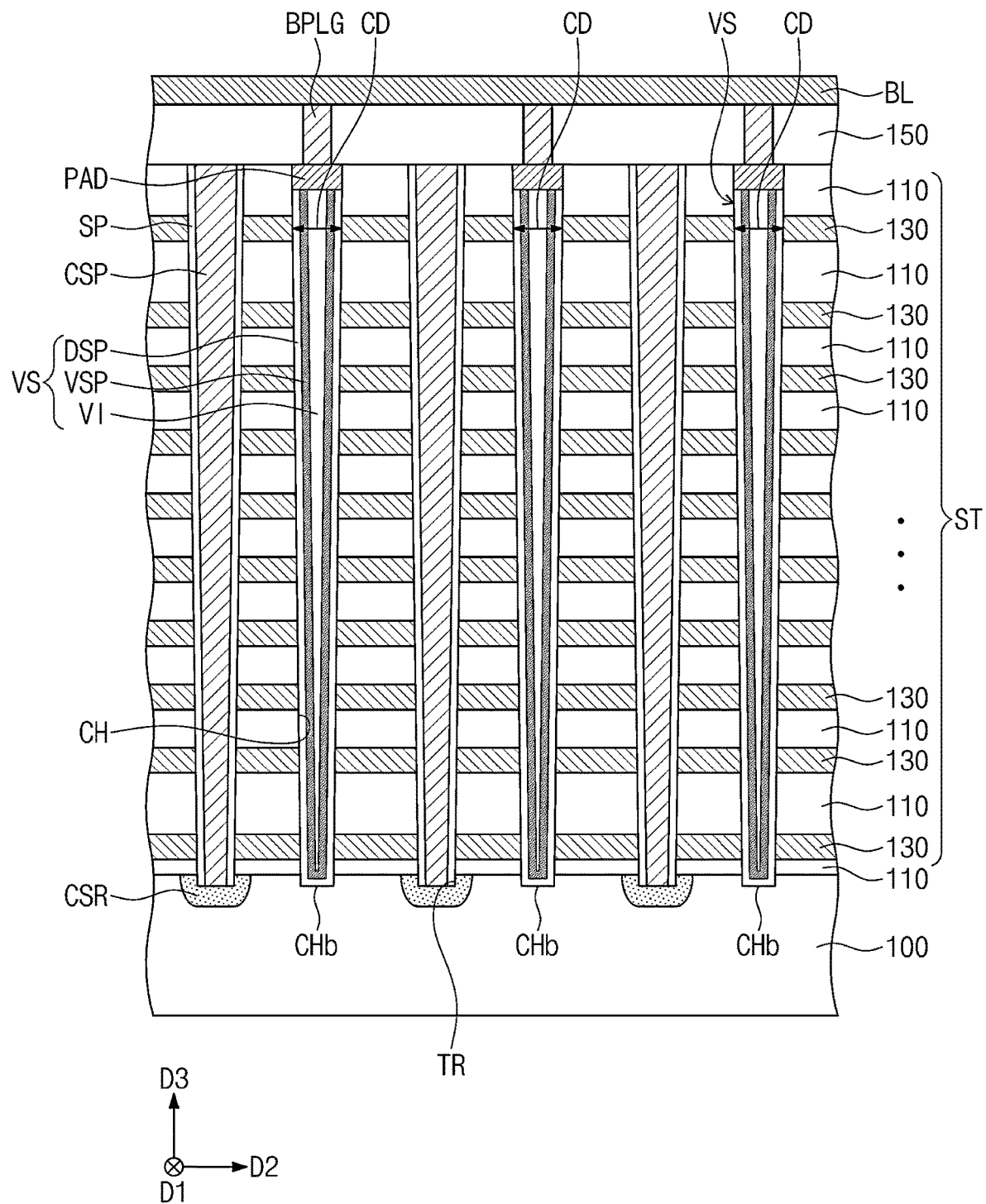

FIGS. 7 to 9 are sectional views illustrating a method of fabricating a semiconductor device using a method of monitoring a semiconductor device fabrication process, according to an example embodiment of the inventive concept. For example, FIGS. 7 to 9 are sectional views illustrating a method of fabricating a three-dimensional semiconductor memory device, which includes vertical channel structures provided in channel holes.

Referring to FIG. 7, interlayer insulating layers 110 and sacrificial layers 120 may be formed on a substrate 100. The interlayer insulating layers 110 and the sacrificial layers 120 may be alternately stacked in a third direction D3, which is perpendicular to a top surface of the substrate 100, to form a stack ST. The interlayer insulating layers 110 and the sacrificial layers 120 may be formed by, for example, a chemical vapor deposition method.

The sacrificial layers 120 of the stack ST may be formed of or include at least one of materials that have an etch selectivity with respect to the interlayer insulating layers 110. For example, the sacrificial layers 120 may be formed of or include silicon nitride, and the interlayer insulating layers 110 may be formed of or include silicon oxide.

The lowermost one of the interlayer insulating layers 110 may be formed between the lowermost one of the sacrificial layers 120 and the substrate 100 and may have a smaller thickness (i.e., in the third direction D3) than the others of the interlayer insulating layers 110. For example, the lowermost one of the interlayer insulating layers 110 may be formed by a thermal oxidation process.

Referring to FIG. 8, channel holes CH may be formed to penetrate the interlayer insulating layers 110 and the sacrificial layers 120 of the stack ST. The channel holes CH may be formed to expose side surfaces of the interlayer insulating layers 110 and the sacrificial layers 120. In an embodiment, the channel holes CH may be formed to partially recess the substrate 100 and to expose portions of the top surface of the substrate 100. Bottom surfaces CHb of the channel holes CH may be located at a level that is lower than the top surface of the substrate 100. The bottom surfaces CHb of the channel holes CH may be located at substantially the same level.

The channel holes CH may be formed by forming a mask pattern on the stack ST and performing the etching process using the mask pattern as an etch mask. In an embodiment, the etching process may be performed in an over-etch manner, and in this case, the top surface of the substrate 100 may be partially recessed. For example, the etching process may be a dry etching process using plasma.

The monitoring method in the semiconductor fabrication process according to an example embodiment of the inventive concept may be used to monitor results of the etching process, which is performed to form the channel holes CH. In detail, a fraction of the channel holes CH, whose line widths CD do not exceed a predetermined criterion, may be estimated. For example, the line width CD of each channel hole CH may be a maximum width of the channel hole CH. Hereinafter, experimental examples 1 and 2, in which line widths CD of the channel holes CH are estimated based on the third index $N_3$, will be described in more detail with reference to FIGS. 6A and 6B.

TABLE 1

| Criterion: Not open 1% | | Actual | | |
|---|---|---|---|---|
| | | Failed | Normal | Sum |
| Estimated | Failed | 30 | 2 | 32 |
| | Normal | 19 | 51 | 70 |
| | Sum | 49 | 53 | 102 |

Table 1 represents the experimental example 1, in which 102 wafers with the stack ST were used. In the experimental example 1, when a fraction of not-open channel holes CH whose line widths CD did not exceed a predetermined criterion was higher than 1%, the wafer was classified to be failed, and when the fraction was smaller than 1%, the wafer was classified to be normal. According to the experimental example 1, a ratio of the estimated number of failed wafers to the actual number of failed wafers was about 61.2% (=30/49), and a ratio of the actual number of failed wafers to the estimated number of failed wafers was about 93.8% (=30/32).

TABLE 2

| Criterion: Not open 10% | | Actual | | |
|---|---|---|---|---|
| | | Failed | Normal | Sum |
| Estimated | Failed | 253 | 4 | 257 |
| | Normal | 12 | 16 | 28 |
| | Sum | 265 | 20 | 285 |

Table 2 represents the experimental example 2, in which 285 wafers with the stack ST were used. In the experimental example 2, when a fraction of not-open channel holes CH whose line widths CD did not exceed a predetermined criterion was higher than 10%, the wafer was classified to be failed, and when the fraction was smaller than 10%, the wafer was classified to be normal. According to the experimental example 2, a ratio of the estimated number of failed wafers to the actual number of failed wafers was about 95.5% (=253/265), and a ratio of the actual number of failed wafers to the estimated number of failed wafers was about 98.4% (=253/257).

Referring to FIGS. 8 and 9, vertical structures VS, each of which includes a data storage pattern DSP, a vertical semiconductor pattern VSP, and an insulating gap-filling pattern VI, may be formed in the channel holes CH, respectively. The data storage pattern DSP may be formed on a side surface of the channel hole CH. The vertical semiconductor pattern VSP may be conformally deposited on the data storage pattern DSP exposed by the channel holes CH. The data storage pattern DSP and the vertical semiconductor pattern VSP may be formed by a chemical vapor deposition method or an atomic layer deposition method. In an embodiment, the data storage pattern DSP and the vertical semiconductor pattern VSP may have a pipe or macaroni shape with closed bottom.

The insulating gap-filling pattern VI may fill a space enclosed by the data storage pattern DSP and the vertical semiconductor pattern VSP. The formation of the insulating gap-filling pattern VI may include filling an internal space of the channel hole CH, in which the vertical semiconductor pattern VSP is provided, with an insulating material and performing a planarization process on the insulating material to expose the top surface of the stack ST.

A conductive pad PAD may be formed on a top surface of each of the vertical structures VS. The conductive pad PAD may be formed by partially recessing the vertical structures VS and filling the recessed regions with a doped semiconductor material or a conductive material.

A separation trench TR may be formed to penetrate the stack ST. In an embodiment, the separation trench TR may be formed to recess a portion of the substrate 100 or to expose the top surface of the substrate 100. Also, the separation trench TR may be formed to expose side surfaces of the interlayer insulating layers 110 and the sacrificial layers 120.

The separation trench TR may be formed by forming a mask pattern on the stack ST and patterning the stack ST using the mask pattern as an etch mask. In an embodiment, the patterning may be performed in an over-etch manner, and thus, the top surface of the substrate 100 may be partially recessed. The separation trench TR may be spaced apart from the channel holes CH and may have a line shape extending in a first direction D1.

The sacrificial layers 120 may be selectively removed through the separation trench TR. The selective removal of the sacrificial layers 120 may be performed by a wet etching process using an etching solution. For example, the sacrificial layers 120 may be selectively removed using an etching solution containing hydrofluoric acid or phosphoric acid.

Gate electrodes 130 may be formed in empty spaces, which are formed by removing the sacrificial layers 120. The formation of the gate electrodes 130 may include forming a conductive layer to fill the empty spaces, which are formed by removing the sacrificial layers 120, and a portion of the separation trench TR, and removing the conductive layer from the separation trench TR. The gate electrodes 130 may be formed by, for example, a chemical vapor deposition method or an atomic layer deposition method.

As a result of the formation of the gate electrodes 130, the stacks ST may be formed to include the gate electrodes 130 and the interlayer insulating layers 110, which are alternately stacked in the third direction D3 perpendicular to the top surface of the substrate 100. The stacks ST may be extended in the first direction D1 and may be spaced apart from each other in a second direction D2, when viewed in a plan view. The top surface of the substrate 100 may be partially exposed between adjacent ones of the stacks ST.

The top surface of the substrate 100 exposed by the separation trench TR may be doped to have a conductivity type different from the substrate 100, and thus, a common source region CSR may be formed in the substrate 100 between adjacent ones of the stacks ST.

Insulating spacers SP may be formed to cover side surfaces of the separation trench TR. The insulating spacers SP may be formed by conformally depositing a spacer layer on the substrate 100 and the stacks ST and exposing the common source region CSR using an etch-back process or the like. A common source plug CSP may be formed in an internal space of the separation trench TR, which are surrounded by the insulating spacers SP.

A capping insulating layer 150 may be formed on the stacks ST, the vertical structures VS, and the common source plug CSP. The capping insulating layer 150 may cover a top surface of the uppermost one of the interlayer insulating layers 110, a top surface of the conductive pad PAD, and a top surface of the common source plug CSP. Thereafter, a bit line contact plug BPLG may be formed to penetrate the capping insulating layer 150 and to be connected to the conductive pad PAD. Next, a bit line BL, which is extended in the second direction D2 and is connected to the bit line contact plug BPLG, may be formed on the capping insulating layer 150.

Further processes may be performed, for example to form a three-dimensional semiconductor memory device. For example, additional conductive and insulating layers may be deposited on the wafer to form semiconductor chips, the semiconductor chips may then be singulated, packaged on a package substrate, and encapsulated by an encapsulant to form a semiconductor package.

The monitoring method in the semiconductor fabrication process according to an example embodiment of the inventive concept may be used to precisely monitor results of the etching process, which is performed to form the channel holes CH, and thus, it may be possible to precisely predict the presence or absence of a failure in a three-dimensional semiconductor memory device.

However, the inventive concept is not limited to the three-dimensional semiconductor memory device described with reference to FIGS. 7 to 9 and may be used to fabricate various semiconductor devices (e.g., dynamic random access memory (DRAM) devices) requiring an etching process.

In a method of monitoring a semiconductor device fabrication process according to an example embodiment of the inventive concept, it may be possible to obtain information on a total etching amount of a to-be-processed layer and to reduce a deviation between several chambers. Thus, it may be possible to precisely estimate a result of an etching process and the presence or absence of a failure, based on an index, which is used as a reference to compare and/or evaluate etching amounts in several chambers.

While example embodiments of the inventive concept have been particularly shown and described, it will be understood by one of ordinary skill in the art that variations in form and detail may be made therein without departing from the spirit and scope of the attached claims.

What is claimed is:

1. A method of monitoring a semiconductor device fabrication process, comprising:
   determining a normalization range of a target byproduct, which is a measurement target of byproducts produced in a chamber by an etching process, the byproducts comprising the target byproduct and a non-target byproduct, the target byproduct comprising a first target byproduct, which is produced by the etching process on a to-be-processed layer, and a second target byproduct, which is produced before the etching process on the to-be-processed layer;
   obtaining a first index from a ratio of the target byproduct to the non-target byproduct;
   obtaining a second index by subtracting an emission intensity of the second target byproduct from the first index;
   obtaining a third index by integrating the second index on a time interval; and
   estimating a result of the etching process and presence or absence of a failure, based on the third index.

2. The method of claim 1,
   wherein the target byproduct is a polyatomic molecule, and
   wherein an emission intensity of the target byproduct comprises a plurality of peaks.

3. The method of claim 1, wherein the obtaining of the second index is performed by subtracting a value of the first index, which corresponds to a start time of the etching process, from the first index given as a function of time.

4. The method of claim 1, wherein the obtaining of the third index is performed by integrating the second index, which is given as a function of time, on a time interval from a start time of the etching process to an end time of the etching process.

5. The method of claim 1, wherein the etching process is a dry etching process using plasma.

6. The method of claim 1, wherein the chamber, in which the etching process is performed, comprises:
   a chuck, on which the to-be-processed layer is loaded;
   a gas supplying part configured to supply an etching gas;
   a view port of a window structure surrounded by a sidewall of the chamber;
   a calibration adapter provided on the view port;
   a calibration device connected to the calibration adapter through a first optical fiber; and
   a sensor connected to the view port to a second optical fiber.

7. The method of claim 6,
   wherein the view port comprises an optical filter, and
   wherein the sensor comprises an optical emission spectroscope (OES).

8. The method of claim 1,
   wherein the chamber, in which the etching process is performed, is provided in plural, and
   wherein the estimating of the result of the etching process and the presence or absence of a failure is performed by comparing the third indices, which are obtained from the chambers.

9. The method of claim 8,
   wherein the estimating of the result of the etching process and the presence or absence of a failure is performed based on a distribution of a critical dimension with respect to the third index of each of the chambers, and
   wherein the critical dimension is defined as a line width of a pattern, which is formed in the to-be-processed layer as a result of the etching process.

10. The method of claim 1,
    wherein the normalization range comprises a first wavelength range, in which an emission peak of the target byproduct is included, and a second wavelength range, which is two times wider than the first wavelength range and has a same center as that of the first wavelength range, and
    wherein the obtaining of the first index comprises:
    calculating a first intensity by integrating an emission intensity of the target byproduct with respect to a wavelength on the first wavelength range;
    calculating a second intensity by integrating the emission intensity of the target byproduct with respect to a wavelength on the second wavelength range; and
    calculating a ratio of the first intensity to a difference between the first intensity and the second intensity.

11. The method of claim 10,
    wherein the target byproduct is CN,
    wherein the first wavelength range is from 384.5 nm to 388.5 nm, and
    wherein the second wavelength range is from 382.5 nm to 390.5 nm.

12. The method of claim 10, wherein the first index represents a signal-to-noise ratio of the target byproduct at the first wavelength range.

13. A method of fabricating a semiconductor device, comprising:

fabricating a semiconductor device through a deposition process of forming a plurality of layers on a substrate and an etching process of etching at least a portion of the plurality of layers; and monitoring the fabricating of the semiconductor device, wherein the monitoring the fabricating of the semiconductor device comprises:

determining a normalization range of a target byproduct, which is a measurement target of byproducts produced in a chamber by the etching process, the byproducts comprising the target byproduct and a non-target byproduct, the target byproduct comprising a first target byproduct, which is produced by the etching process on a to-be-processed layer, and a second target byproduct, which is produced before the etching process on the to-be-processed layer;

obtaining a first index from a ratio of the target byproduct to the non-target byproduct;

obtaining a second index by subtracting an emission intensity of the second target byproduct from the first index;

obtaining a third index by integrating the second index on a time interval; and estimating a result of the etching process and presence or absence of a failure, based on the third index.

14. The method of claim 13, wherein the obtaining of the second index is performed by subtracting a value of the first index, which corresponds to a start time of the etching process, from the first index given as a function of time.

15. The method of claim 13, wherein the obtaining of the third index is performed by integrating the second index, which is given as a function of time, on a time interval from a start time of the etching process to an end time of the etching process.

16. The method of claim 13, wherein the chamber, in which the etching process is performed, is provided in plural, and wherein the estimating of the result of the etching process and the presence or absence of a failure is performed by comparing the third indices, which are obtained from the chambers.

17. A method of fabricating a semiconductor device, comprising:

alternately stacking insulating layers and sacrificial layers on a substrate to form a stack;

performing a plasma etching process to form a plurality of channel holes penetrating the stack; and monitoring the plasma etching process on the channel holes, wherein the monitoring of the plasma etching process comprises:

determining a normalization range of a target byproduct, which is a measurement target of byproducts produced in a chamber by the plasma etching process, the byproducts comprising the target byproduct and a non-target byproduct, the target byproduct comprising a first target byproduct, which is produced by the plasma etching process on a to-be-processed layer, and a second target byproduct, which is produced before the plasma etching process on the to-be-processed layer;

obtaining a first index from a ratio of the target byproduct to the non-target byproduct;

obtaining a second index by subtracting an emission intensity of the second target byproduct from the first index;

obtaining a third index by integrating the second index on a time interval; and estimating a result of the plasma etching process and presence or absence of a failure, based on the third index.

18. The method of claim 17, after the plasma etching process of forming the channel holes penetrating the stack, further comprising:

forming a data storage pattern and a vertical semiconductor pattern in each of the channel holes;

forming a separation trench, which is spaced apart from the channel holes, is formed to penetrate the stack, and is extended in a line shape;

removing the sacrificial layers exposed by the separation trench;

forming gate electrodes in empty spaces, which are formed by removing the sacrificial layers; and forming a common source plug in the separation trench.

19. The method of claim 17, wherein the estimating of the result of the plasma etching process and the presence or absence of a failure is performed by estimating a line width of each of the channel holes, based on the third index.

20. The method of claim 17, wherein the sacrificial layers comprise silicon nitride, wherein the insulating layers comprise silicon oxide, and wherein the target byproduct is CN.

* * * * *